United States Patent
Lenssen et al.

(10) Patent No.: US 7,224,634 B2
(45) Date of Patent: May 29, 2007

(54) HARDWARE SECURITY DEVICE FOR MAGNETIC MEMORY CELLS

(75) Inventors: Kars-Michiel Hubert Lenssen, Eindhoven (NL); Adrianus Johannes Maria Denissen, Eindhoven (NL); Nicolaas Lambert, Eindhoven (NL)

(73) Assignee: NXP B.V., Eindhoven (NL)

( * ) Notice: Subject to any disclaimer, the term of this patent is extended or adjusted under 35 U.S.C. 154(b) by 20 days.

(21) Appl. No.: 10/539,795

(22) PCT Filed: Dec. 15, 2003

(86) PCT No.: PCT/IB03/05999

§ 371 (c)(1),
(2), (4) Date: Jun. 18, 2005

(87) PCT Pub. No.: WO2004/055823

PCT Pub. Date: Jul. 1, 2004

(65) Prior Publication Data

US 2006/0146597 A1    Jul. 6, 2006

(30) Foreign Application Priority Data

Feb. 20, 2003    (EP) .................................. 03100403

(51) Int. Cl.
*G11C 8/20*    (2006.01)
(52) U.S. Cl. ...................... 365/228; 365/173; 365/171; 365/158
(58) Field of Classification Search ........... 365/185.04, 365/228, 173, 171, 158
See application file for complete search history.

(56) References Cited

U.S. PATENT DOCUMENTS

| | | | | |
|---|---|---|---|---|
| 4,932,053 A | * | 6/1990 | Fruhauf et al. | 380/252 |
| 6,130,814 A | * | 10/2000 | Sun | 361/143 |
| 6,452,283 B2 | * | 9/2002 | Smola et al. | 257/784 |
| 6,532,163 B2 | * | 3/2003 | Okazawa | 365/97 |
| 2006/0179490 A1 | * | 8/2006 | Lenssen et al. | 726/34 |

FOREIGN PATENT DOCUMENTS

WO    WO 2005/050664 A1 *  6/2005

* cited by examiner

*Primary Examiner*—Andrew Q. Tran
(74) *Attorney, Agent, or Firm*—Peter Zawilski

(57) ABSTRACT

The present invention provides a special structure of magnetic elements, e.g. MRAM elements, as a security device for IC's containing magnetic memory cells. In an example embodiment, the structure may comprise a combination of two or more associated magnetic elements with pre-set anti-parallel magnetization directions. By determining the polarisation directions of the magnetic elements, exposure to an external magnetic field can be detected. Inverse polarisation directions indicate a normal situation, aligned polarisation directions indicate that the MRAM-array has been exposed to an external field. In this way it can be detected whether a user has tried to erase or alter the data stored in the MRAM in an illegal way. The IC can regularly check the resistance of the security system during operation. Upon detection of a field exposure, the IC can erase all MRAM data, reset itself or, block its functioning.

11 Claims, 2 Drawing Sheets

HARDWARE SECURITY DEVICE FOR MAGNETIC MEMORY CELLS

The present invention relates to magnetic memories or magnetoresistive random access memories (MRAM), and more particularly to a method and device to protect magnetic memory cells against misuse by exposure to magnetic fields or to detect unintentional exposure to magnetic fields in order to avoid malfunctioning due to this exposure.

Magnetic or Magnetoresistive Random Access Memory (MRAM) is currently being considered by many companies as a successor to flash memory. It has the potential to replace all but the fastest static RAM (SRAM) memories. This makes MRAM very suitable as embedded memory for System on Chip (SoC). It is a non-volatile memory (NVM) device, which means that no power is required to sustain the stored information. This is seen as an advantage over most other types of memory.

The MRAM concept was originally developed at Honeywell Corp. USA, and uses magnetization direction in a magnetic multi-layer device as information storage and the resultant resistance difference for information readout. As with all memory devices, each cell in an MRAM array must be able to store at least two states which represent either a "1" or a "0".

Different kinds of magnetoresistive (MR) effects exist, of which the Giant Magneto-Resistance (GMR) and Tunnel Magneto-Resistance (TMR) are currently the most important ones. The GMR effect and the TMR or Magnetic Tunnel Junction (MTJ) or Spin Dependent Tunneling (SDT) effect provide possibilities to realize non-volatile magnetic memories. These devices comprise a stack of thin films of which at least two are ferromagnetic or ferrimagnetic, and which are separated by a non-magnetic interlayer. GMR is the magneto-resistance for structures with conductor inter-layers and TMR is the magneto-resistance for structures with dielectric inter-layers. If a very thin conductor is placed between two ferromagnetic or ferrimagnetic films, then the effective in-plane resistance of the composite multi-layer structure is smallest when the magnetization directions of the films are parallel and largest when the magnetization directions of the films are anti-parallel. If a thin dielectric interlayer is placed between two ferromagnetic or ferrimagnetic films, tunneling current between the films is observed to be the largest (or thus resistance to be the smallest) when the magnetization directions of the films are parallel and tunneling current between the films is the smallest (or thus resistance the largest) when the magnetization directions of the films are anti-parallel.

Magneto-resistance is usually measured as the percentage increase in resistance of the above structures going from parallel to anti-parallel magnetization states. TMR devices provide higher percentage magneto-resistance than GMR structures, and thus have the potential for higher signals and higher speed. Recent results indicate tunneling giving over 40% magneto-resistance, compared to 10–14% magneto-resistance in good GMR cells.

A typical MRAM device comprises a plurality of magnetoresistive memory elements, e.g. magnetic tunneling junction (MTJ) elements, arranged in an array. MTJ memory elements generally include a layered structure comprising a fixed or pinned layer, a free layer and a dielectric barrier in between. The pinned layer of magnetic material has a magnetic vector that always points in the same direction. The magnetic vector of the free layer is free, but constrained within the easy axis of the layer, which is determined chiefly by the physical dimensions of the element. The magnetic vector of the free layer points in either of two directions: parallel or anti-parallel with the magnetization direction of the pinned layer, which coincides with the said easy axis. The fundamental principle of MRAM is the storage of information as binary data, e.g. as "0" and "1", based on directions of magnetization. This is why the magnetic data is non-volatile and will not change until it is affected by an external magnetic field. When both magnetic films of the layered structure of an MRAM-cell are magnetized with the same orientation (parallel), the data is either of two binary values, e.g. "0", otherwise, if both magnetic film of the layered structure of the MRAM-cell are magnetized with inverse orientation (anti-parallel), the data is the other binary value, e.g. "1". Making use of the fact that the resistance of the layered structure varies depending on whether or not the orientations are parallel, the system can discriminate both binary values of the data, e.g. "0" or "1".

It is a disadvantage of MRAM cells, and of magnetic memory cells in general, that an intentional or unintentional exposure to strong magnetic fields makes them vulnerable.

For certain applications, for example in smartcards, the data stored in the magnetic memory cells, for example in MRAM-cells, is secret. It is essential that the data is secure, and cannot be retrieved in other ways than via the normal, controlled electrical connections, e.g. from the pins of an IC. The data has to be protected to prevent anyone from reading it in an unauthorized way, and to prevent anyone to use it if it has been changed in an unauthorized way.

In WO 00/07184 this problem is being solved by using a recordable data layer within a perishable information storage mechanism, which in response to at least one of a predetermined use or a time factor is perishable, and thus eliminates access to the recorded data.

One of the embodiments described is in MRAM technology, where magnetoresistive memory cells each include a magnetic memory cell element such as a multi-layer GMR material, in which data is stored in the form of magnetizing vectors. Data stored in the MRAM-cells is read by a reader that has the ability to exert magnetic fields sufficient to erase the data. Therefore, while reading or accessing information, a magnetic field which destroys the recorded data is produced.

A disadvantage of the solution described above is the fact that recorded data becomes inaccessible even if it is not being misused. Access to the data is denied or data is destroyed even if it is just used in a normal and authorized way.

Accordingly, it is highly desirable, for certain applications (for example smartcards), to provide a secured MRAM array such that data stored in MRAM-cells of the array cannot be altered in another way than through the normal, controlled way, e.g. by electrical connections from the pins of an IC.

It is an object of the present invention to provide a hardware protection for indicating that an array of magnetic memory cells, for example an MRAM array, has been exposed to an external magnetic field, either intentionally or unintentionally, especially in applications where security is essential or in which the integrity of data is crucial.

The above objective is accomplished by a method and device according to the present invention.

The present invention provides an array of magnetic memory cells, provided with at least one security device. The magnetic memory cells may for example, but not limited thereto, be an array of MRAM-cells of any MR-type, such as e.g. AMR, GMR, TMR. Alternatively, the magnetic memory cells may be on a magnetic tape, such as e.g. a magnetic strip on a bankcard, they may for (removable) hard disks (HDD), or floppy disks. The at least one security device according to the present invention comprises a first magnetic element and a second magnetic element each having a pre-set magnetization direction. The pre-set magnetization directions of the first and second magnetic elements are different from each other. The first and second magnetic elements are suitable for aligning their magnetization direction with magnetic field lines of an externally applied magnetic field, to thereby indicate exposure of the array to this external magnetic field.

According to one embodiment of the present invention the first and second magnetic elements may comprise MRAM-cells of any MR-type, such as AMR, GMR, TMR for example. Alternatively, other magnetic elements can be used for the security device, like devices comprising magnetic tape. In the latter case, the security device of the present invention can be implemented on a security tag or security chip which may be implemented e.g. in a smartcard or HDD to monitor its integrity. An advantage of using MRAM-cells for the security device is that the security device can be easily added to an embedded or stand-alone array of magnetic cells. In contrast to magnetic tape, the security device according to the present invention based on MR-elements can be easily read out electronically and without any mechanical movement required.

Furthermore, in a security device comprising MRAM-cells, the MRAM-cells may each have a free magnetic layer with pre-set inverse magnetization directions. By changing this pre-set magnetization directions and measuring the resulting change in resistance of the MRAM-cells of the security device, exposure to an external magnetic field can be detected.

According to the present invention the security device may be built adjacent to the magnetic memory cells that have to be protected. Through this, the adjacent security device will be affected when a magnetic memory cell of the array is being affected by an external magnetic field, rather than a security device further away from the affected magnetic memory cell.

According to yet another embodiment of the present invention a plurality of security devices may be spatially distributed amongst the magnetic memory cells in the array. This is advantageous in that more security devices spatially distributed amongst the magnetic memory cells give more accurate detection of exposure to external magnetic fields at all locations in the array.

The present invention also provides an integrated circuit comprising an array of magnetic memory cells provided with at least one security device as described above. The integrated circuit may furthermore comprise a control circuit for erasing data content of the magnetic memory cells and/or for blocking the functioning of the integrated circuit upon indication by the security device of exposure of the array to the externally applied magnetic field.

The present invention furthermore provides a method for indicating exposure of an array of magnetic memory cells to an external magnetic field. The method comprises changing a pre-set magnetization direction of a magnetic security device when the array is exposed to the external magnetic field. The security device may comprise a first magnetic element having a first pre-set magnetization direction and a second magnetic element having a second pre-set magnetization direction, the first and second pre-set magnetization directions being different from each other. The changing of the pre-set magnetization directions may comprise aligning the magnetization direction of at least one of the first and second magnetic elements with the external magnetic field.

The present invention provides a method wherein the changing of the pre-set magnetization directions may comprise changing the magnetization direction of at least one of two inversely magnetized MRAM-cells.

The method according to the present invention may further comprise determining the change in magnetization direction of at least one of the first and second magnetic elements, for example by measuring a resistance difference of first and second MRAM-cells if the security device comprises first and second MRAM-cells with a pre-set magnetization direction as magnetic elements.

These and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

Figure 1:
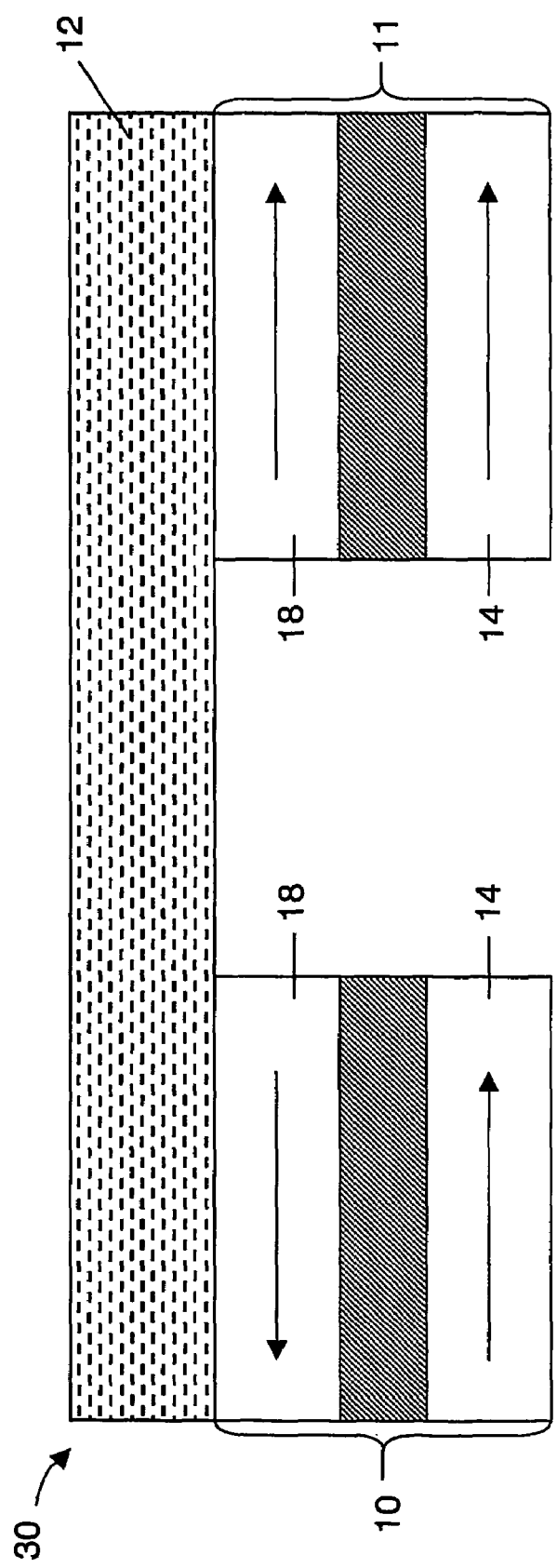
FIG. 1 is a schematic illustration of a side view of an embodiment of a security device according to the present invention.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. Where the term "comprising" is used in the present description and claims, it does not exclude other elements or steps.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

Figure 2:
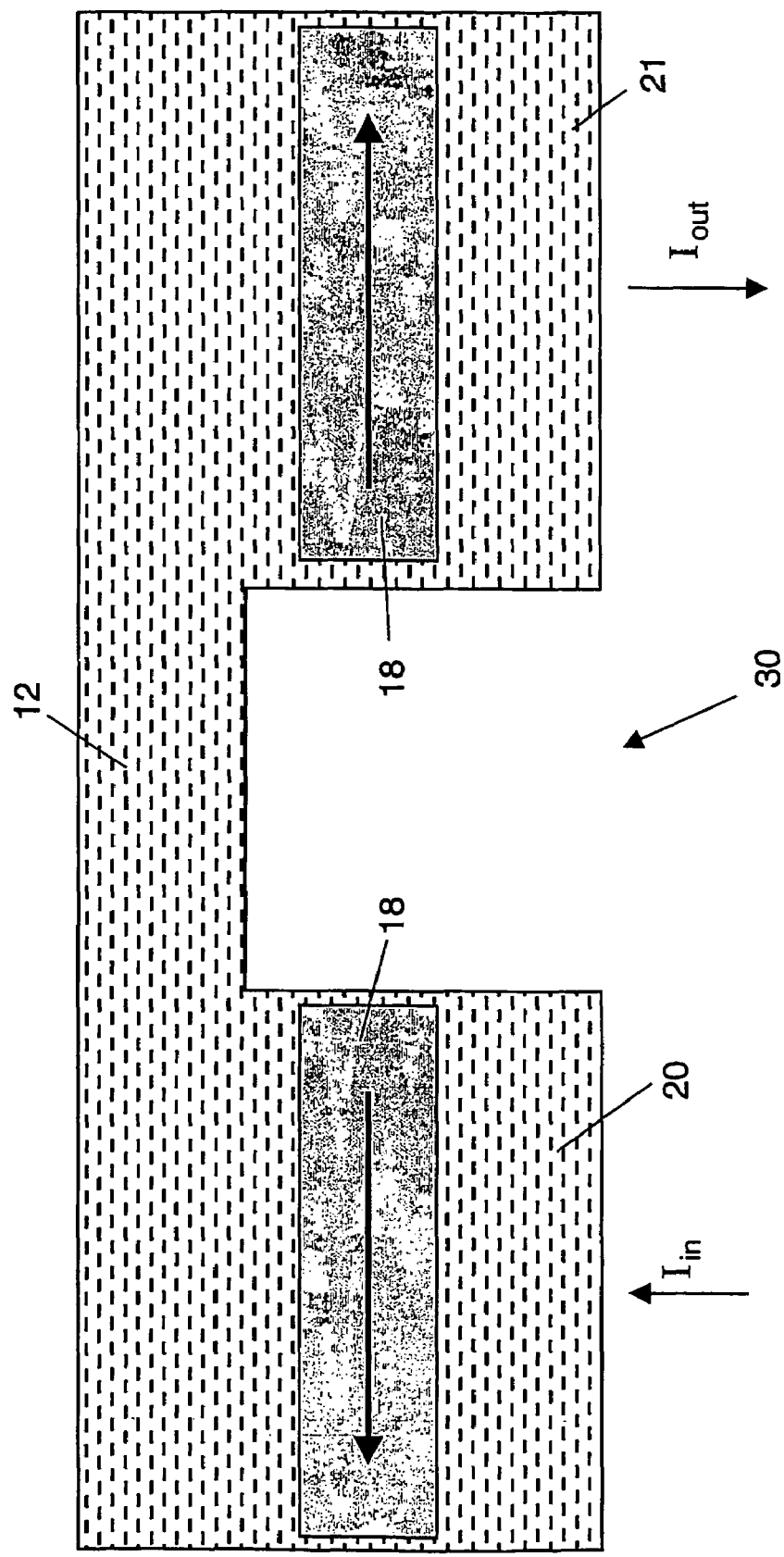
FIG. 2 is a schematic illustration of a top view of the security device of FIG. 1.

According to the present invention, an array of magnetic memory cells (not represented in the drawings) having a data content is provided, which array is provided with a security device 30, e.g. as shown in FIGS. 1 and 2, for indicating exposure of the array to an external magnetic field. In the embodiment described, the magnetic memory cells comprise MRAM-cells.

The array of magnetoresistive memory cells, each memory cell comprising a magnetoresistive memory element, is logically organized in rows and columns. Throughout this description, the terms "horizontal" and "vertical" are used to provide a co-ordinate system and for ease of explanation only. They do not need to, but may, refer to an actual physical direction of the device. Furthermore, the terms "column" and "row" are used to describe sets of array elements which are linked together. The linking can be in the form of a Cartesian array of rows and columns; however, the present invention is not limited thereto. As will be understood by those skilled in the art, columns and rows can be easily interchanged and it is intended in this disclosure that these terms be interchangeable. Also, non-Cartesian arrays may be constructed and are included within the scope of the invention. Accordingly the terms "row" and "column" should be interpreted widely. To facilitate in this wide interpretation, the claims refer to logically organized rows and columns. By this is meant that sets of memory elements are linked together in a topologically linear intersecting manner; however, that the physical or topographical arrangement need not be so. For example, the rows may be circles and the columns may be radii of these circles and the circles and radii are described in this invention as "logically organized" in rows and columns. Also, specific names of the various lines, e.g. bit line and word line, or row line and column line, are intended to be generic names used to facilitate the explanation and to refer to a particular function and this specific choice of words is not intended to in any way limit the invention. It should be understood that all these terms are used only to facilitate a better understanding of the specific structure being described, and are in no way intended to limit the invention.

According to the present invention, the security device 30 comprises two inversely magnetized or biased magnetic elements. According to a first embodiment of the present invention, these inversely binary magnetized or biased magnetic elements may be formed by discrete magnetic elements, e.g. by a combination of two associated MRAM-cells 10, 11 with inversely or differently polarized magnetization directions as shown in FIGS. 1 and 2. With inverse magnetization directions is meant that each cell has at least two stable or quasi-stable magnetization directions, and the two cells are arranged so that the magnetization direction of one cell is reversed with respect to the other cell. The magnetization direction of each element can be set independently, or both magnetization directions can be set in one go. For example, the free layers 18 of the associated MRAM-cells 10, 11 are inversely polarized, i.e. if the free layer 18 of the first MRAM-cell 10 is polarized in one direction, the free layer 18 of the second MRAM-cell 11 is polarized in an opposite direction. For example, the first MRAM-cell 10 may have anti-parallel magnetization directions of its fixed or pinned layer 14 and its free layer 18 and the second MRAM-cell 11 may have parallel magnetization directions of its fixed or pinned layer 14 and free layer 18, as shown in FIG. 1. The pinned layers 14 of the associated MRAM-cells 10, 11 both have the same magnetization direction in this case, while the free layers 18 have different magnetization directions. Alternatively, the fixed or pinned layers 14 of the associated MRAM-cells 10, 11 may have opposite magnetization directions (not represented in the drawings). As, according to the present embodiment, the free layers 18 of the associated MRAM-cells also have inverse magnetization directions with respect to each other, either the fixed layer 14 and the free layer 18 of both the first and second MRAM-cell maybe inversely polarized or the fixed layer 14 and the free layer 18 of both the first and second MRAM-cell may have a parallel polarization.

Writing ("setting/initializing") of the bits of the security device 30 can for example be done by one single conductor 12 which is placed over the elements 10, 11 of the security device so that an opposite magnetic field is created at the location of the two elements 10, 11 by one and the same current pulse. In order to obtain this, the write line 12 may have a U-shape with two legs 20, 21, each of the elements 10, 11 of the security device 30 being influenced by the current pulse through one of the leg 20, 21. No two current lines are needed for setting the bits of the security device, as they do not need to be separately settable. The write line 12 should in this case be preferably close to the free layer 18 as shown in FIG. 1.

Alternatively, initializing the bits of the security device 30 may be done by independently setting the bits, by means of combined current through crossing current lines above and below the elements 10, 11 of the security device 30 for example (not represented in the drawings).

A security device 30 according to the present invention may be incorporated in an array of MRAM-cells adjacent the MRAM-cells that have to be protected. First current lines, e.g. digitlines, travel along the rows of the array on one side of the MRAM-cells and second current lines, e.g. bitlines, travel down the columns of the array on the opposite side of the memory cells. According to another embodiment, the security device 30 may be placed under an angle with respect to the normal MRAM-cells in the array.

Because of the small dimensions of the MRAM-cells in an array and the high density thereof, exposure to an external magnetic field, either intentionally (tampering) or unintentionally, results in changes to the magnetization directions of the cells. In particular the cell-pair-wise opposed magnetization directions are disturbed and a parallel orientation of the magnetization directions of free layers of neighboring MRAM-cells is produced. This parallel orientation may be along the direction of the external magnetic field. The hardware security device 30 as described in the present invention, is based on the above described principle.

When the security device 30 is exposed to an external magnetic field, the magnetization direction of the magnetic elements of the security device 30 will all be changed so as to point in the direction of the externally applied magnetic field. According to the first embodiment of the present invention, the magnetization direction of the free layer 18 of one of the MRAM-cells 10, 11 of the security device 30 will be changed. Magnetization vectors of the free layers 18 will all point at the same direction, which also corresponds to the magnetization direction of the external magnetic field. Through this, both MRAM-cells 10, 11 of the security device 30 now have parallel magnetization directions.

It is known that parallel and anti-parallel configurations of MRAM-cells 10, 11 have different resistances. The resistance of an MRAM-cell 10, 11 is either low or high dependent on the relative polarization, parallel or anti-parallel, of the free layer 18 with respect to the pinned magnetic layer 14. Therefore, by measuring the resistance difference of both MRAM-cells 10, 11 of the security device 30, their mutual magnetization direction can easily be determined. For the embodiment shown in FIG. 1, a significant resistance difference, indicates a normal situation, i.e. one of the MRAM-cells 10 being in anti-parallel configuration and the other MRAM-cell 11 being in parallel configuration, which means the array of MRAM-cells has not been exposed to an external magnetic field. No resistance difference between both MRAM-cells 10, 11 of the security device 30 indicates that both MR AM-cells 10, 11 have equally polarized magnetization directions and thus has been exposed to an external magnetic field, which has changed the magnetization direction in the free layer 18 of the MRAM-cells 10, 11 of the array. Alternatively, according to any of the embodiments, not represented in the drawings, with inversely polarized fixed or pinned magnetic layers, no resistance difference between both MRAM-cells of the security device indicates a normal situation, and a significant resistance difference between both MRAM-cells of the security device indicates that the security device has been exposed to an external magnetic field.

In this way, by determining the polarization directions of both magnetic elements of the security device, it can be detected whether it has been tried to erase or alter the data stored in the MRAM-array in an illegal way. Besides that, the present invention can also be used to detect unintentional exposure to magnetic fields in order to avoid malfunctioning due to this exposure.

An IC wherein at least one security device 30 according to the present invention is present, can regularly check the polarization direction, e.g. the resistance, of the magnetic elements of the security device during operation. Upon detection of a same polarization direction for both magnetic elements of the security device, e.g. by measuring a resistance difference or a same resistance of two MRAM-cells, depending on the configuration thereof, and hence upon detection of exposure to an external magnetic field, the IC can, dependent on what is desirable for the specific application, erase the data of all MRAM-cells, or can reset itself or block its function.

In a further embodiment of the present invention a number of security devices 30 according to the present invention are spatially distributed amongst the MRAM-cells of the array. In practice it is not obvious to make sure that the security device 30 can only be set in the "safe" configuration once during the fabrication process. This may, for example, be achieved by employing a special bond pad to the first current line 12, that is only used to set the magnetization directions of the magnetic elements, e.g. MRAM-cells 10, 11, of the security device 30, e.g. just after testing, and which is not connected externally outside the package of the MRAM-array. It may also be accomplished by a kind of write-lock flag that makes it write-protected forever after once being set.

The present invention provides a hardware security device to detect exposure to external magnetic fields that can easily be added to an embedded or stand-alone MRAM. Especially in applications where security is essential, such as for example in smartcards, or in which the integrity of data is crucial, e.g. program code of the operation system in embedded MRAM in SoC, the use of a security device according to the present invention may be of importance. Moreover, it provides a detection for unintentional exposure to an external magnetic field, e.g. from a permanent magnet or from write equipment for the magnetic strip on a smartcard. The invention can also reduce the need for implementing very good magnetic shielding in MRAM ICs, since unintentional exposure to a large field, which is rare in normal use, can now be detected.

It is to be understood that although preferred embodiments, specific constructions and configurations, as well as materials, have been discussed herein for devices according to the present invention, various changes or modifications in form and detail may be made without departing from the scope and spirit of this invention.

The invention claimed is:

1. An array of magnetic memory cells provided with at least one security device, wherein the at least one security device comprises
   a first magnetic element and a second magnetic element each having a pre-set magnetization direction, the pre-set magnetization direction of the first and second magnetic elements being different from each other, the first and second magnetic elements being suitable for aligning their magnetization direction with magnetic field lines of an externally applied magnetic field, to thereby indicate exposure of the array to said externally applied magnetic field; and
   a conductor placed over the first magnetic element and the second magnetic element of the security device, the conductor providing a current path for creating an initializing magnetic field to pre-set each magnetization direction of the first and second magnetic element, the initializing magnetic field having a first polarity at the first magnetic element, and a second polarity at the second magnetic element, the second polarity opposite the first polarity.

2. An array of magnetic memory cells according to claim 1, wherein the first and second magnetic elements comprise MRAM-cells.

3. An array of magnetic memory cells according to claim 2, the MRAM-cells having a free magnetic layer, wherein the MRAM-cells have pre-set inverse magnetization directions of the free magnetic layer.

4. An array of magnetic memory cells according to claim 1, wherein the security device is built adjacent to the magnetic memory cells that have to be protected.

5. An array of magnetic memory cells according to claim 1, there being a plurality of security devices spatially distributed amongst the magnetic memory cells in the array.

6. An integrated circuit comprising an array of magnetic memory cells according to claim 1.

7. An integrated circuit according to claim 6, furthermore comprising a control circuit for erasing data content of the magnetic memory cells or for blocking the functioning of the integrated circuit upon indication by the security device of exposure of the array to the externally applied magnetic field.

8. A method for indicating exposure of an array of magnetic memory cells to an external magnetic field, the method comprising:
   initializing magnetization directions of a magnetic security device, using a single conductor providing an initializing magnetic field over the magnetic security device,
   wherein the security device includes a first magnetic element and a second magnetic element, each magnetic element being initialized in anti-parallel directions,
   wherein the first magnetic element is initialized in a first pre-set magnetization direction and the second magnetic element initialized in a second pre-set magnetization direction, the and second pre-set magnetization directions being different from each other, the changing of the pre-set magnetization directions comprising aligning the magnetization direction of at least one of the first and second magnetic elements with the external magnetic field;
   exposing the array to the external magnetic field; and
   changing a pre-set magnetization direction of a magnetic security device.

9. A method according to claim 8, wherein the changing of the pre-set magnetization directions comprises changing the magnetization direction of at least one of two inversely magnetized MRAM-cells.

10. A method according to claim 8, the method further comprising determining the change in magnetization direction.

11. A method according to claim 10, the security device comprising a first and a second MRAM-cell with the pre-set magnetization direction, wherein the change in magnetization direction is determined by measuring a resistance difference of the first and second MRAM-cells of the security device.

* * * * *